United States Patent
Chang et al.

(10) Patent No.: US 6,426,246 B1
(45) Date of Patent: Jul. 30, 2002

(54) METHOD FOR FORMING THIN FILM TRANSISTOR WITH LATERAL CRYSTALLIZATION

(75) Inventors: Ting-Chang Chang, Hsin-Chu; Du-Zen Peng, Chu-Pei; Chun-Yen Chang, Hsin-Chu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/789,347

(22) Filed: Feb. 21, 2001

(51) Int. Cl.$^7$ .......................... H01L 21/00; H01L 21/84
(52) U.S. Cl. ................. 438/166; 438/164; 438/163; 438/150
(58) Field of Search ................. 438/149–166

(56) References Cited

U.S. PATENT DOCUMENTS

| | | | |
|---|---|---|---|
| 5,710,050 A | * 1/1998 | Makita et al. | 438/162 |
| 5,766,989 A | * 6/1998 | Maegawa et al. | 117/8 |
| 5,824,574 A | * 10/1998 | Yamazaki et al. | 117/7 |
| 5,837,569 A | * 11/1998 | Makita et al. | 438/166 |
| 5,946,562 A | * 8/1999 | Kuo | 438/162 |
| 6,177,301 B1 | * 1/2001 | Jung | 438/150 |
| 6,235,563 B1 | * 5/2001 | Oka et al. | 438/166 |
| 6,306,697 B1 | * 10/2001 | Chang et al. | 438/166 |

* cited by examiner

Primary Examiner—John F. Niebling
Assistant Examiner—Jennifer M. Kennedy
(74) Attorney, Agent, or Firm—Powell Goldstein Frazer & Murphy LLP

(57) ABSTRACT

A method for forming thin film transistor with lateral crystallization. The method at least includes the following steps. First of all, an insulation substrate is provided. Then, an amorphous silicon layer is provided on the insulation substrate. The seeds are formed by annealing a portion of the amorphous silicon layer by excimer laser system, and the lateral-growth grain is formed by using the seeds to grow laterally by annealing the amorphous silicon layer, wherein the amorphous silicon layer defines an active region. Then, sequentially a dielectric layer and a polysilicon layer is deposited on the active region, wherein the dielectric layer and the polysilicon layer are gate electrodes, a gate is defined on the substrate, and the polysilicon layer is formed by etching. Next, source and drain regions are formed by implanting numerous ions into amorphous silicon layer by using the gate electrode as a mask.

39 Claims, 5 Drawing Sheets

METHOD FOR FORMING THIN FILM TRANSISTOR WITH LATERAL CRYSTALLIZATION

BACKGROUND OF THE INVENTION

1. Field of the Invention

The present invention generally relates to a method for manufacturing a metal-induced-laterally-crystallization thin-film transistor, and more particularly to a method for forming a thin film transistor with lateral crystallization.

2. Description of the Prior Art

A method of crystallizing amorphous silicon using heat treatment at a low temperature after a certain kind of a metal layer has been deposited on the amorphous silicon is know as an MIC process. The MIC process is beneficial due to the low temperature crystallization of amorphous silicon. However, the MIC process has not been applied to electronic devices because of an inflow of metal into the thin film of crystallized silicon formed underneath the metal layer, which causes the intrinsic characteristics of amorphous silicon to deteriorate.

FIGS. 1A to 1C show a method of fabricating a channel region of a thin film transistor using an MILC process according to a related art.

Referring to FIG. 1A, an amorphous silicon layer 110, as an active layer is deposited on an insulation substrate 100 having a buffer film (not shown in the above figure) on its upper part, and the active layer 110 is patterned by photolithography and an etching process. A gate insulation layer 120 and a gate electrode 130 are formed on the active layer by conventional processes.

Referring to FIG. 1B, a nickel layer 140 is formed to a thickness of 10 angstrom by sputtering nickel on the entire surface of the formed structure. Then a source region 110S and a drain 110D are formed at portions of the active layer by heavily doping the entire surface of the formed structure with impurities. Between the source region 110S and drain region 110D, a channel region 110C is formed on the substrate 100.

Referring to FIG. 1C, amorphous silicon in the active layer is crystallized by heating the substrate 100 at a temperature of 350° C.–500° C. Then the source region 110S and drain region 110D on which the nickel layer 140 has been formed become the MIC regions having silicon crystallized by an MIC process. The channel region 110C without the nickel layer 140 formed directly thereon becomes the MILC region where silicon has been crystallized by an MILC process. Impurities are activated in the source region 110S and drain regions 110D during the heat treatment as amorphous silicon is crystallized in the active layer.

In the thin film transistor fabricated by the above-described method according to the conventional art, the channel region 110C has boundaries defined by the crystalline structure of silicon in the MIC regions facing that of silicon in the adjacent MILC region. Since the boundary between the MIC region and the MILC region is located at the junction where the source or drain region meets the channel region, an abrupt difference in the crystal structure appears in the junction and the metal from the MIC region contaminates the adjacent MILC region. Consequently, a trap is formed at such junctions as soon as the TFT is turned on which causes unstable channel regions and deteriorates the characteristics of the thin film transistor.

Accordingly, it is desired to provide a method for forming thin film transistor with lateral crystallization, to not only improve planarity of interface, increase grain of big polycrystalline silicon channel and lateral grain growth and carrier mobility, but also to overcome the drawbacks of the conventional grain formation process.

SUMMARY OF THE INVENTION

In accordance with the present invention, a method is provided for forming thin film transistor with lateral crystallization that substantially can be used to improve the carrier mobility issue in the conventional process.

One of the objectives of the present invention is to provide a method to form a thin film transistor with lateral crystallization to improve the carrier mobility issue.

Another of the objectives of the present invention is to provide a method to form a thin film transistor with lateral crystallization using a very simple process, having a low temperature and maintaining high carrier mobility.

A further objective of the present invention is to provide a method to form a thin film transistor with lateral crystallization improving the planarity of the interface, increasing the grain of the big polycrystalline silicon channel, and also increasing lateral-growth grain.

In order to achieve the above objectives, the present invention provides a method for forming a thin film transistor with lateral crystallization. The method at least includes the following steps. First of all, an insulation substrate is provided. Then, an amorphous silicon layer is provided on the insulation substrate. The seeds are formed by annealing a portion of the amorphous silicon layer by excimer laser system, and the lateral-growth grain is formed by using the seeds to grow laterally by annealing the amorphous silicon layer, wherein the amorphous silicon layer defines an active region. Then, sequentially a dielectric layer and a polysilicon layer are deposited on the active region, wherein the dielectric layer and the polysilicon layer are gate electrodes, a gate is defined on the substrate, and the polysilicon layer is formed by etching. Next, source and drain regions are formed by implanting numerous ions into amorphous silicon layer by using the gate electrode as a mask.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

Some embodiments of the invention will now be described in greater detail. Nevertheless, it should be recognized that the present invention can be practiced in a wide range of other embodiments besides those explicitly described here. The scope of the present invention is expressly not limited except as specified in the accompanying claims.

FIG. 2A to 2G are cross-sectional views of a method for forming thin film transistor with lateral crystallization in accordance with one preferred embodiment of the present invention.

Figure 1A:
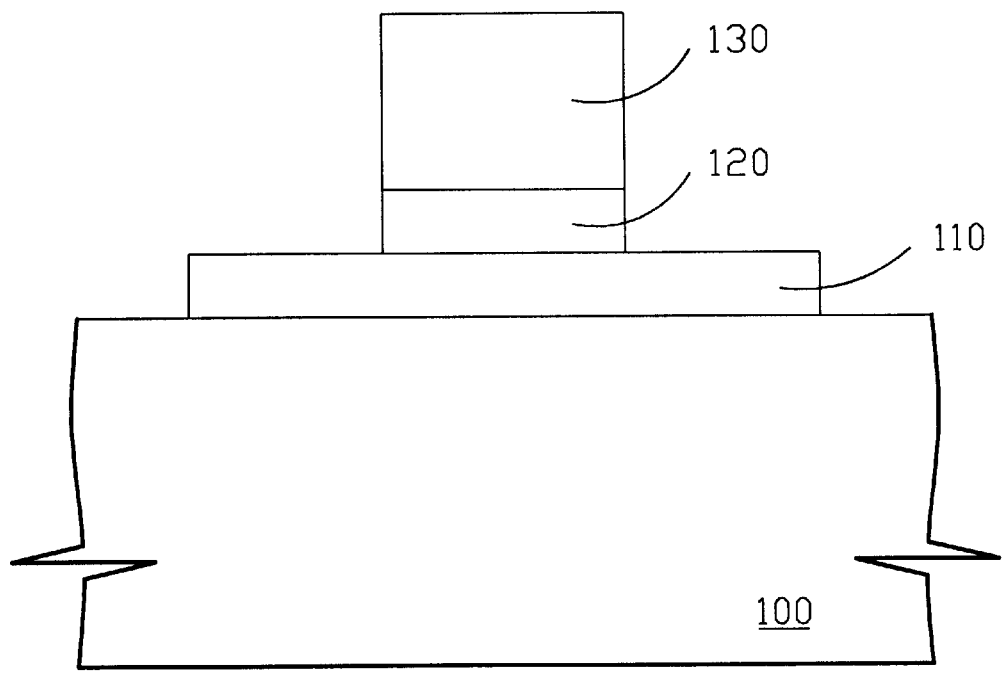
FIGS. 1A to 1C show a method of fabricating a channel region of a thin film transistor using an MILC process according to the prior art.
Figure 1B:
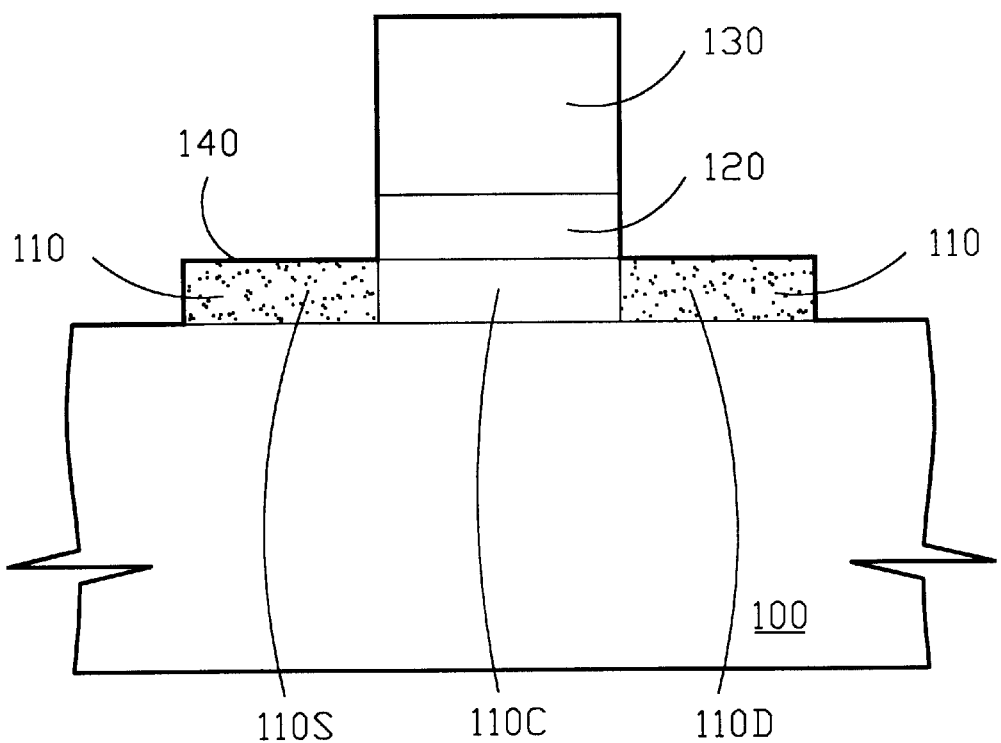
Figure 1C:
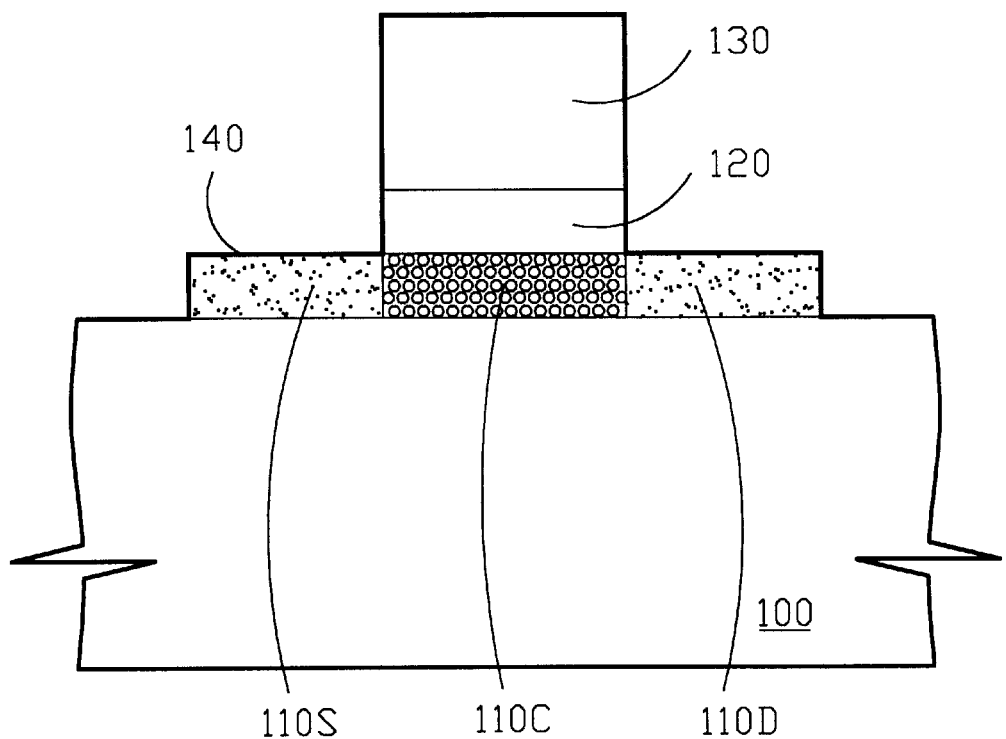
Figure 2A:
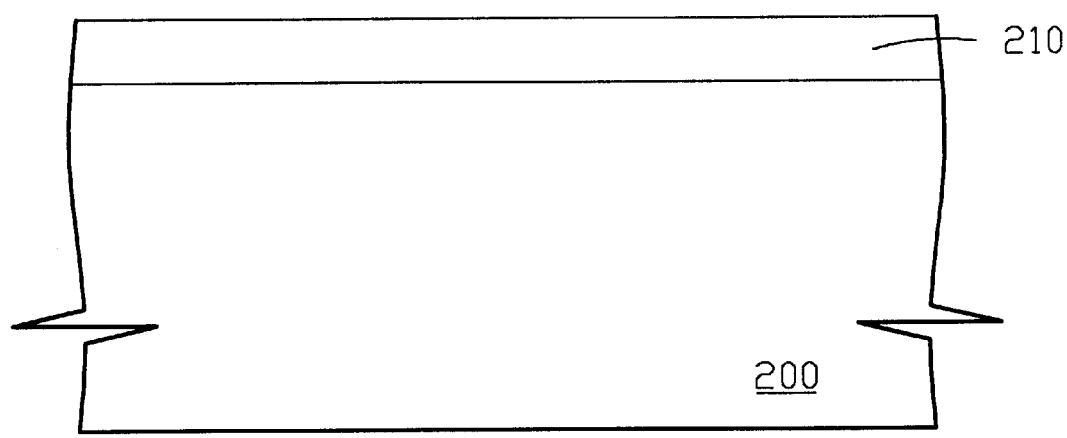
FIGS. 2A to 2G are cross-sectional views of a method for forming thin film transistor with lateral crystallization in accordance with one preferred embodiment of the present invention.

Referring to FIG. 2A, a glass substrate 20 is provided which comprises a silicon dioxide substrate. First of all, a film 210 is formed on the glass substrate 200. The film can be an amorphous silicon layer formed by a chemical vapor deposition method, e.g., plasma-enhanced CVD, APCVD, and LPCVD, but preferably LPCVD at 450° C. temperature.

Figure 2B:
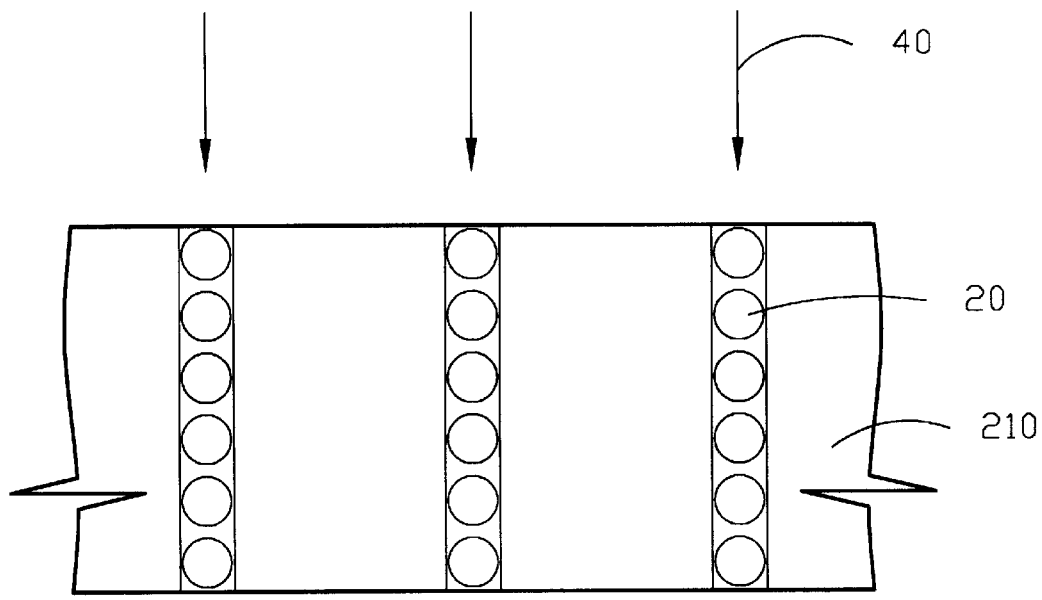

Referring to FIG. 2B, as the enlarged image of layer 210 show, using local annealing method, amorphous silicon layer 210 is changed by excimer laser 40 to seeds 20, which will be kept in a high temperature melting condition. The excimer laser system 40 illuminates the amorphous silicon layer 210 regionally. The temperature of the local annealing method using excimer laser 40 will be between 400 and 500° C.

Figure 2C:
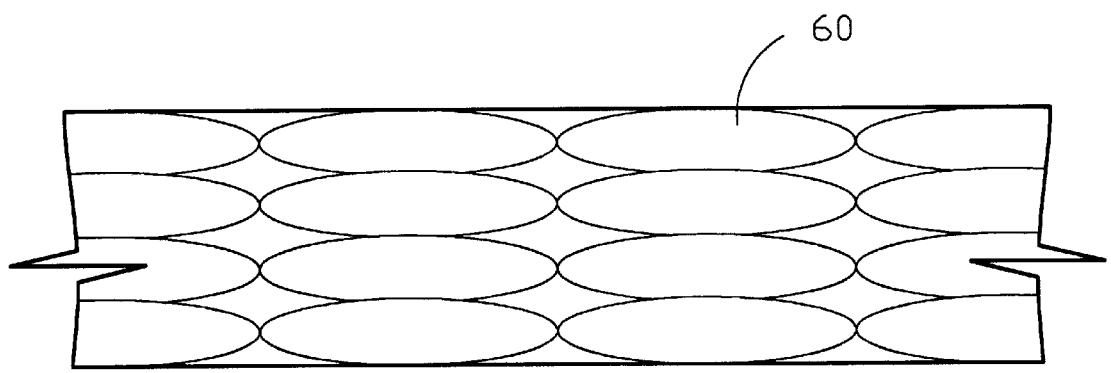

Referring to FIG. 2C, next, in a rapid annealing process, the seed 20 will be changed to lateral-growth grain 60. In this annealing process, the seeds 20 will grow laterally into grain 60. Therefor, the amorphous silicon layer 210 is now a polysilicon layer.

Figure 2D:
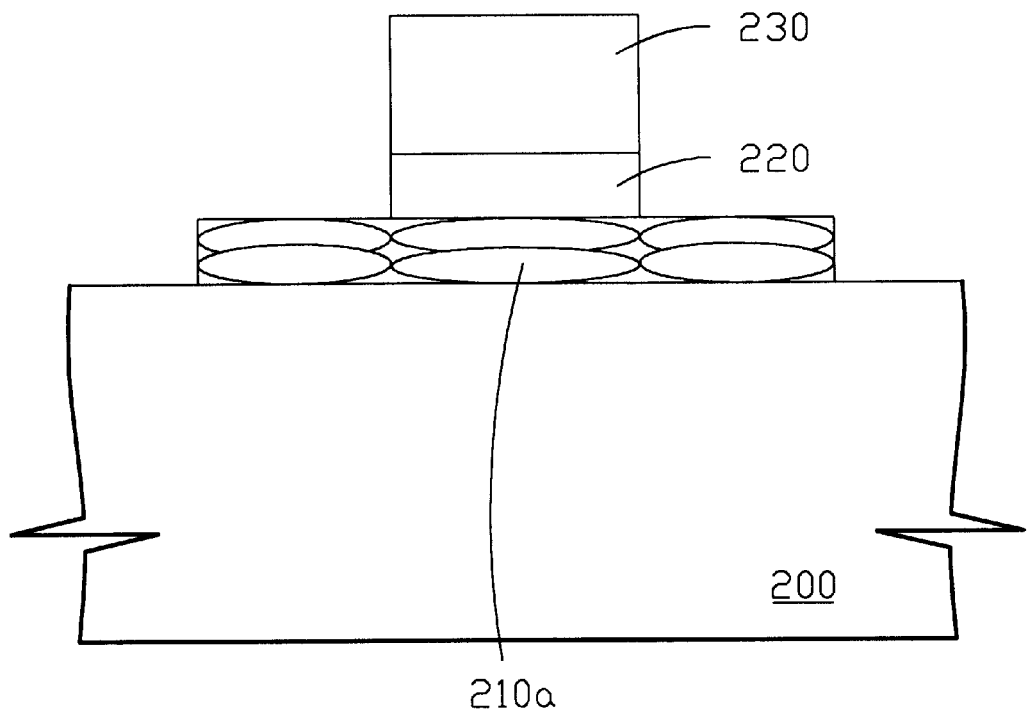

Referring to FIG. 2D, an amorphous silicon layer named active region 210a is formed on the glass substrate 200. The active region 210a is deposited by LPCVD (Low Pressure Chemical Vapor Deposition). It has a thickness of about 1000 Å and is then patterned by photolithography and etching. Next, a dielectric layer 220, usually $SiO_2$ layer, with a thickness of about 400 $Å_1$ is deposited on active region 210a by atmospheric pressure CVD method, which uses $SiH_4$ as a reaction gas. The process is conducted under a pressure of 0.5~1 torr and a temperature of 400~500° C. Using an alternative method, a dielectric layer 220 is deposited on active region 210a by plasma enhanced CVD method, which uses $TEOS/O_2$ as a reaction gas. Then, a metal layer for forming a gate electrode 230 is deposited on the dielectric layer 220 to a thickness of about 500 Å by sputtering. The metal layer is patterned by using photolithography to form the oxide layer 220. The gate electrode 230 is patterned by using photolithography to form the dielectric layer 220 and the gate electrode 230 is used as an etch mask to etch the dielectric layer 220.

Figure 2E:
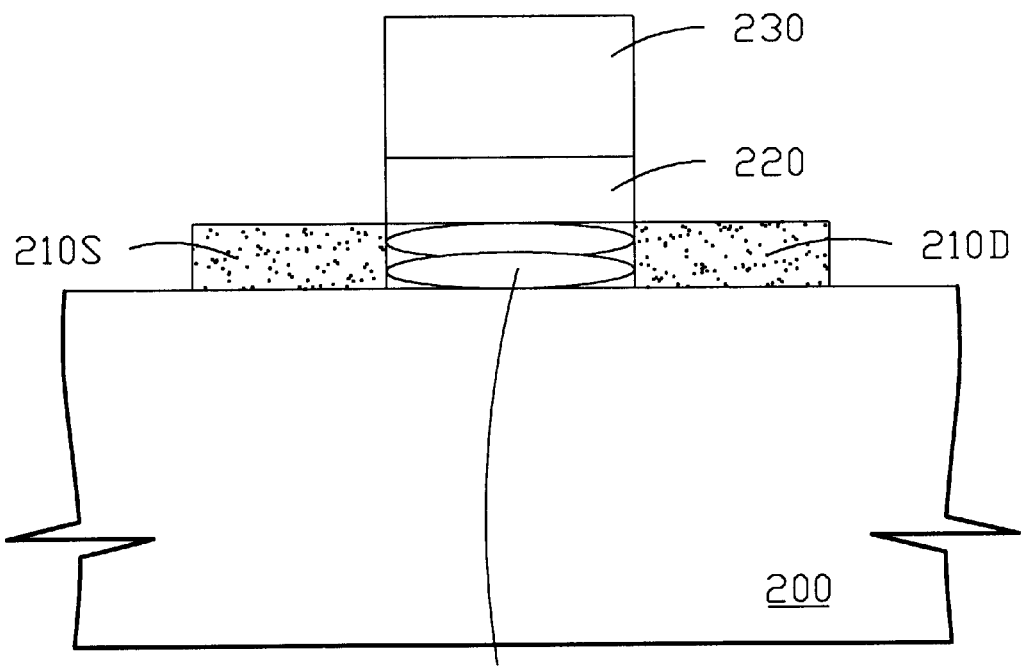

Referring to FIG. 2E, source region 210S and drain region 210D are formed in portions of the active layer 210 by implanting high concentration ions in the active layer 210a, wherein the dielectric layer 220 and the gate electrode 230 function as a doping mask.

Figure 2F:
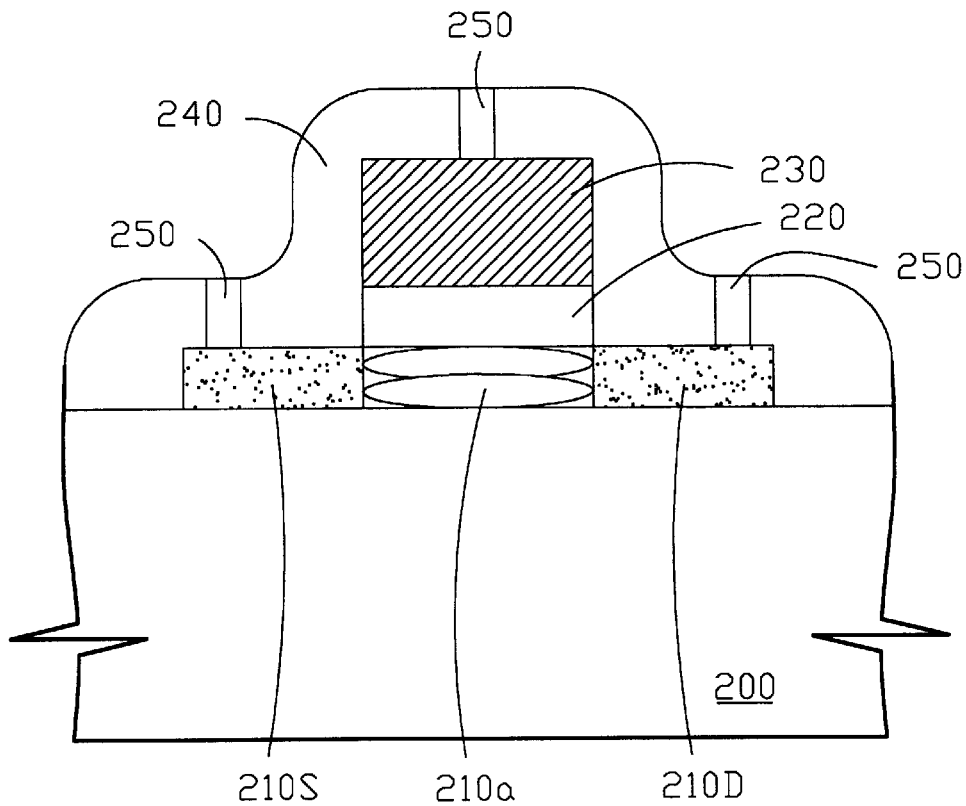

Referring to FIG. 2F, a low temperature oxide silicon 240, having a thickness of 2000 Å to 3000 Å, is formed by plasma enhanced CVD method on the already formed structure. The contact holes 250 are defined on the gate 230, the source 210S, and the drain 210D regions, then are patterned by using photolithography.

Figure 2G:
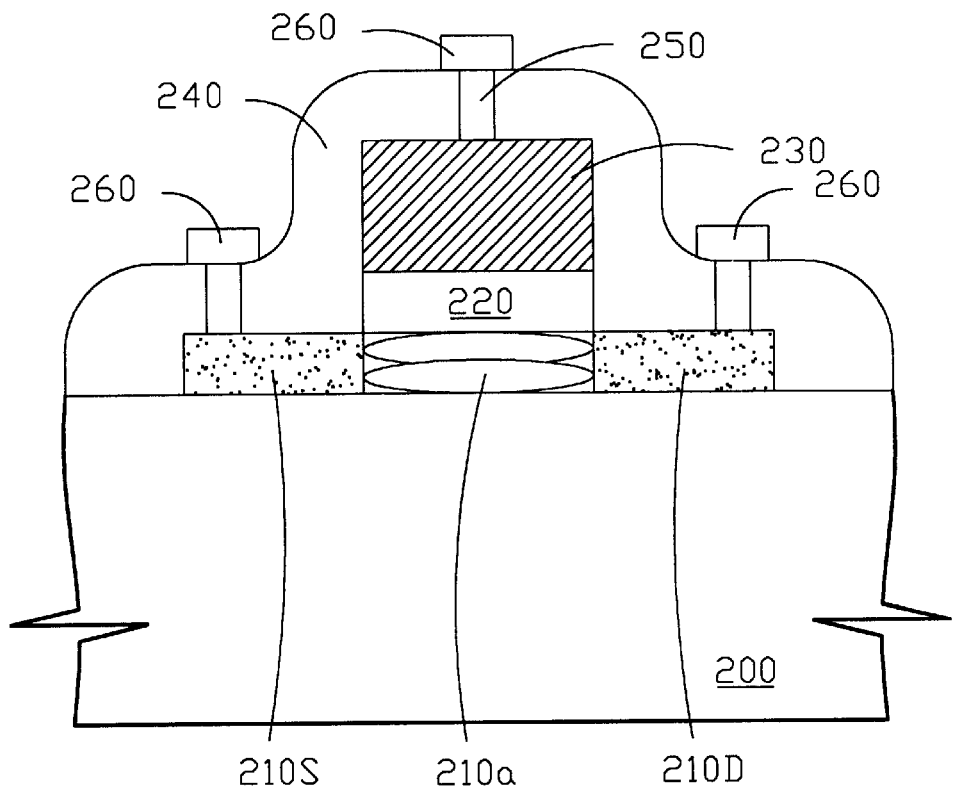

Referring to FIG. 2G, the metal layer 260, having a thickness about 5000 Å, is formed by evaporating aluminum on the already formed structure. The metal layer 260 comprises aluminum. The aluminum layer 260 is, thereafter, formed by isotropic etching on contact region 250.

The thin film transistor with lateral crystallization formed using the above explained method, has the following advantages:
1. The present invention is to provide a method to form thin film transistor with lateral crystallization to solve carrier mobility issues.
2. The present invention is to provide a method to form thin film transistor with lateral crystallization using a very simple process, having a low temperature and maintaining high carrier mobility.
3. The present invention is to provide a method to form thin film transistor with lateral crystallization improving planarity of interface, increasing the grain of big polycrystalline silicon channel, and also increasing lateral-growth grain.

Although specific embodiments have been illustrated and described, it will be obvious to those skilled in the art that various modifications may be made without departing form what is intended to be limited solely by the appended claims.

What is claimed is:

1. A method for forming a thin-film transistor (TFT), the method comprising the steps of:
   providing an insulation substrate;
   depositing an amorphous silicon layer on said insulation substrate;
   forming seeds by annealing a portion of said amorphous silicon layer;
   forming a lateral-growth grain by annealing said amorphous silicon layer, wherein said amorphous silicon layer defines an active region;
   depositing sequentially a dielectric layer and a polysilicon layer on said active region, wherein said dielectric layer and said polysilicon layer are gate electrode; and
   forming a source and a drain regions by implanting a plurality of ions into film by using said gate electrode as a mask.

2. The method according to claim 1, wherein said insulation substrate is transparent.

3. The method according to claim 1, wherein said amorphous silicon layer is formed at a temperature between 450° C. and 550° C.

4. The method according to claim 1, wherein said seeds are formed by using excimer laser system.

5. The method according to claim 1, wherein said lateral-growth grain is formed by using the seeds to grow laterally.

6. The method according to claim 4, wherein said excimer laser system illuminates the amorphous silicon layer regionally.

7. The method according to claim 4, wherein said lateral-growth grain is formed at a temperature between 400° C. and 500° C.

8. The method according to claim 1, wherein said active region is formed by photolithography and etching technique.

9. The method according to claim 1, wherein said dielectric layer comprises silicon dioxide.

10. The method according to claim 1, wherein thickness of said dielectric layer is between 400 angstrom and 1000 angstrom.

11. The method according to claim 1, wherein said dielectric layer is deposited by plasma enhanced CVD method.

12. The method according to claim 1, wherein thickness of said gate is between 2000 angstrom and 3000 angstrom.

13. The method according to claim 1, wherein said gate is formed by photolithography technique.

14. The method according to claim 1, wherein said source and drain regions is implanted by high-concentration ions.

15. A method for forming a thin-film transistor (TFT), the method comprising the steps of:
   providing an insulation substrate;
   depositing an amorphous silicon layer on said insulation substrate;
   forming seeds by annealing a portion of said amorphous silicon layer, wherein said seeds are formed by excimer laser system;
   forming a lateral-growth grain by using said seeds to grow laterally by annealing said amorphous silicon layer, wherein said amorphous silicon layer defines an active region;

depositing sequentially a dielectric layer and a polysilicon layer on said active region, wherein said dielectric layer and said polysilicon layer are gate electrode; and forming a source and a drain regions by implanting a plurality of ions into film by using said gate electrode as a mask.

16. The method according to claim 15, wherein insulation substrate is transparent.

17. The method according to claim 15, wherein said amorphous silicon layer is formed at a temperature between 450° C. and 550° C.

18. The method according to claim 15, wherein said lateral-growth grain is formed at a temperature between 400° C. and 500° C.

19. The method according to claim 15, wherein said excimer laser system illuminates the amorphous silicon layer regionally.

20. The method according to claim 15, wherein said active region is formed by photolithography and etching technique.

21. The method according to claim 15, wherein said dielectric layer comprises silicon dioxide.

22. The method according to claim 15, wherein thickness of said dielectric layer is between 400 angstrom and 1000 angstrom.

23. The method according to claim 15, wherein said dielectric layer is deposited by plasma enhanced CVD method.

24. The method according to claim 15, wherein thickness of said gate is between 2000 angstrom and 3000 angstrom.

25. The method according to claim 15, wherein said gate is formed by photolithography technique.

26. The method according to claim 15, wherein said source and drain regions is implanted by high-concentration ions.

27. A method for forming a thin-film transistor (TFT), the method comprising the steps of:

providing an insulation substrate;

depositing an amorphous silicon layer on said insulation substrate;

illuminating a portion of said amorphous silicon layer to form said seeds in said amorphous silicon layer region by using excimer laser system;

annealing said amorphous silicon layer to form a polysilicon layer having a lateral-growth grain;

depositing sequentially a dielectric layer and a polysilicon layer on said active region, wherein said dielectric layer and said polysilicon layer are gate electrode; and forming a source and a drain regions by implanting a plurality of ions into film by using said gate electrode as a mask.

28. The method according to claim 27, wherein said insulation substrate is transparent.

29. The method according to claim 27, wherein said amorphous silicon layer is formed at a temperature between 450° C. and 550° C.

30. The method according to claim 27, wherein said lateral-growth grain is formed by using the seeds to grow laterally.

31. The method according to claim 27, wherein said excimer laser system illuminates the amorphous silicon layer regionally.

32. The method according to claim 27, wherein said lateral-growth grain is formed at a temperature between 400° C. and 500° C.

33. The method according to claim 27, wherein said active region is formed by photolithography and etching technique.

34. The method according to claim 27, wherein said dielectric layer comprises silicon dioxide.

35. The method according to claim 27, wherein thickness of said dielectric layer is between 400 angstrom and 1000 angstrom.

36. The method according to claim 27, wherein said dielectric layer is deposited by plasma enhanced CVD method.

37. The method according to claim 27, wherein thickness of said gate is between 2000 angstrom and 3000 angstrom.

38. The method according to claim 27, wherein said gate is formed by photolithography technique.

39. The method according to claim 27, wherein said source and drain regions is implanted by high-concentration ions.

* * * * *